(12) United States Patent
Goodwin-Johansson

(10) Patent No.: US 6,236,491 B1
(45) Date of Patent: May 22, 2001

(54) MICROMACHINED ELECTROSTATIC ACTUATOR WITH AIR GAP

(75) Inventor: Scott Halden Goodwin-Johansson, Pittsboro, NC (US)

(73) Assignee: MCNC, Research Triangle Park, NC (US)

( * ) Notice: Subject to any disclaimer, the term of this patent is extended or adjusted under 35 U.S.C. 154(b) by 0 days.

(21) Appl. No.: 09/320,891

(22) Filed: May 27, 1999

(51) Int. Cl.[7] .................................................. G02B 26/00
(52) U.S. Cl. ........................ 359/291; 359/290; 359/292; 359/230
(58) Field of Search .................................. 359/290, 291, 359/292, 224, 230

(56) References Cited

U.S. PATENT DOCUMENTS

| | | | |
|---|---|---|---|
| 3,917,196 | 11/1975 | Pond et al. | 244/77 R |
| 4,025,193 | 5/1977 | Pond et al. | 356/5 |
| 4,209,689 | 6/1980 | Linford et al. | 455/609 |

(List continued on next page.)

FOREIGN PATENT DOCUMENTS

| | | |
|---|---|---|
| 601771 | 3/1978 | (SU) . |
| WO94/19819 | 9/1994 | (WO) . |

OTHER PUBLICATIONS

Surface–Micormachined Electrostatic Microrelay, I. Schiele et al., Sensors and Actuators A 66 (1998) pp. 345–354.
Active Joints for Microrobot Limbs, M. Elwenspoek et al., J. Micromech. Microeng. 2 (1992) pp. 221–223.
Deformable Grating Light Valves for High Resolution Displays, R. B. Apte et al., Solid–State Sensor and Actuator Workshop, Jun. 13–16, 1994, pp. 1–6.
Microwave Reflection Properties of a Rotating Corrugated Metallic Plate Used as a Reflection Modulator G. E. Peckman et al., IEEE Transactions on Antennas and Propagation, vol. 36, No. 7, Jul., 1988, pp. 1000–1006.

(List continued on next page.)

Primary Examiner—Georgia Epps
Assistant Examiner—Tim Thompson
(74) Attorney, Agent, or Firm—Alston & Bird, LLP

(57) ABSTRACT

A MEMS (Micro Electro Mechanical System) electrostatic device operated with lower and more predictable operating voltages is provided. An electrostatic actuator, an electrostatic attenuator of electromagnetic radiation, and a method for attenuating electromagnetic radiation are provided. Improved operating voltage characteristics are achieved by defining a non increasing air gap between the substrate electrode and flexible composite electrode within the electrostatic device. A medial portion of a multilayer flexible composite overlying the electromechanical substrate is held in position regardless of the application of electrostatic force, thereby sustaining the defined air gap. The air gap is relatively constant in separation from the underlying microelectronic surface when the medial portion is cantilevered in one embodiment. A further embodiment provides an air gap that decreases to zero when the medial portion approaches and contacts the underlying microelectronic surface. A moveable distal portion of the flexible composite is biased to curl naturally due to differences in thermal coefficients of expansion between the component layers. In response to electrostatic forces, the distal portion moves and thereby alters the distance separating the flexible composite from the underlying microelectronic surface. Structures and techniques for controlling bias in the medial portion and the resulting air gap are provided. The electrostatic device may be disposed to selectively clear or intercept the path of electromagnetic radiation. Materials used in the attenuator can be selected to pass, reflect, or absorb various types of electromagnetic radiation. A plurality of electromagnetic attenuators may be disposed in an array and selectively activated in subsets.

71 Claims, 8 Drawing Sheets

U.S. PATENT DOCUMENTS

| | | | |
|---|---|---|---|
| 4,361,911 | 11/1982 | Buser et al. | 455/605 |
| 4,447,723 | 5/1984 | Neumann | 250/236 |
| 4,480,162 | 10/1984 | Greenwood | 200/181 |
| 4,517,569 | 5/1985 | Gerharz | 343/180 |
| 4,727,593 | 2/1988 | Goldstein | 455/605 |
| 4,731,879 | 3/1988 | Sepp et al. | 455/605 |
| 4,777,660 | 10/1988 | Gould et al. | 455/605 |
| 4,794,370 | 12/1988 | Simpson et al. | 340/825 |
| 4,983,021 | 1/1991 | Fergason | 350/332 |
| 5,233,459 | 8/1993 | Bozler et al. | 359/230 |
| 5,258,591 | 11/1993 | Buck | 200/181 |
| 5,268,696 | 12/1993 | Buck et al. | 342/372 |
| 5,274,379 | 12/1993 | Carbonneau et al. | 342/45 |
| 5,278,368 | 1/1994 | Kasano et al. | 200/181 |
| 5,311,360 | 5/1994 | Bloom et al. | 359/572 |
| 5,355,241 | 10/1994 | Kelley | 359/170 |
| 5,367,136 | 11/1994 | Buck | 200/600 |
| 5,438,449 | 8/1995 | Chabot et al. | 359/216 |
| 5,463,233 | 10/1995 | Norling | 257/254 |
| 5,544,001 | 8/1996 | Ichiya et al. | 361/233 |
| 5,552,925 | 9/1996 | Worley | 359/230 |
| 5,578,976 | 11/1996 | Yao | 333/262 |
| 5,629,565 | 5/1997 | Schlaak et al. | 257/780 |
| 5,638,946 | 6/1997 | Zavracky | 200/181 |
| 5,658,698 | 8/1997 | Yagi et al. | 430/11 |
| 5,661,592 | 8/1997 | Bornstein et al. | 359/291 |
| 5,666,258 | 9/1997 | Gevatter et al. | 361/207 |
| 5,673,785 | 10/1997 | Schlaak et al. | 200/245 |
| 5,793,519 * | 8/1998 | Furlani et al. | 359/291 |
| 5,818,683 | 10/1998 | Fujii | 361/277 |

OTHER PUBLICATIONS

Large Aperture Stark Modulated Retroreflector at 10.8 $\mu$m, M. B. Klein, J. Appl. Phys. 51(12), Dec. 1980, pp. 6101–6104.

A Large–Aperture Electro–Optic Diffraction Modulator, R. P. Bocker et al., J. Appl. Phys. 50(11), Nov. 1979, pp. 6691–6693.

Integrable Active Microvalve With Surface Micromachined Curled–Up Actuator,J. Haji–Babaer et al., Transducers 1997 International Conference on Solid–State Sensors and Actuators, Chicago, Jun. 16–19, 1997, pp. 833–836.

* cited by examiner

MICROMACHINED ELECTROSTATIC ACTUATOR WITH AIR GAP

FIELD OF THE INVENTION

The present invention relates to microelectromechanical actuator structures, and more particularly to electrostatically activated micromachined actuator structures.

BACKGROUND OF THE INVENTION

Advances in thin film technology have enabled the development of sophisticated integrated circuits. This advanced semiconductor technology has also been leveraged to create MEMS (Micro Electro Mechanical System) structures. MEMS structures are typically capable of motion or applying force. Many different varieties of MEMS devices have been created, including microsensors, microgears, micromotors, and other microengineered devices. MEMS devices are being developed for a wide variety of applications because they provide the advantages of low cost, high reliability and extremely small size.

Design freedom afforded to engineers of MEMS devices has led to the development of various techniques and structures for providing the force necessary to cause the desired motion within microstructures. For example, microcantilevers have been used to apply rotational mechanical force to rotate micromachined springs and gears. Electromagnetic fields have been used to drive micromotors. Piezoelectric forces have also been successfully been used to controllably move micromachined structures. Controlled thermal expansion of actuators or other MEMS components has been used to create forces for driving microdevices. One such device is found in U.S. Pat. No. 5,475,318, which leverages thermal expansion to move a microdevice. A micro cantilever is constructed from materials having different thermal coefficients of expansion. When heated, the bimorph layers arch differently, causing the micro cantilever to move accordingly. A similar mechanism is used to activate a micromachined thermal switch as described in U.S. Pat. No. 5,463,233.

Electrostatic forces have also been used to move structures. Traditional electrostatic devices were constructed from laminated films cut from plastic or mylar materials. A flexible electrode was attached to the film, and another electrode was affixed to a base structure. Electrically energizing the respective electrodes created an electrostatic force attracting the electrodes to each other or repelling them from each other. A representative example of these devices is found in U.S. Pat. No. 4,266,399. These devices work well for typical motive applications, but these devices cannot be constructed in dimensions suitable for miniaturized integrated circuits, biomedical applications, or MEMS structures.

Micromachined MEMS devices have also utilized electrostatic forces to move microstructures. Some MEMS electrostatic devices use relatively rigid cantilever members, as found in U.S. Pat. No. 5,578,976. Similar cantilevered electrostatic devices are described in U.S. Pat. Nos. 5,258,591, 5,367,136, 5,638,946 5,658,698, and 5,666,258. The devices in the above patents fail to disclose flexible electrostatic actuators with a radius of curvature oriented away from the substrate surface. Other MEMS devices disclose curved electrostatic actuators. However, some of these devices incorporate complex geometries using relatively difficult microfabrication techniques. U.S. Pat. Nos. 5,629,565 and 5,673,785 use dual micromechanical substrates to create their respective electrostatic devices. The devices in U.S. Pat. Nos. 5,233,459 and 5,784,189 are formed by using numerous deposition and processing steps. Complex operations are required to create corrugations in the flexible electrodes. In addition, U.S. Pat. No. 5,552,925 also discloses a curved electrostatic electrode. However, the electrode is constructed from two portions, a thinner flexible portion followed by a flat cantilever portion.

Several of the electrostatic MEMS devices include an air gap between the substrate surface and the electrostatic actuator. The electrostatic actuators generally include flexible, curled electrodes. Typically, the gap starts at the beginning of the electrostatic actuator where it separates from the substrate surface and increases continuously along the length of the air gap. The size of the air gap increases as the actuator curls further away from the substrate surface along its length. The air gap separation between the substrate electrode and actuator electrode affects the operating voltage required to move the actuator. The larger the air gap or the higher the rate of increase, the higher the voltage required to operate the actuator. Further, due to manufacturing process and material variations, the size and shape of the air gap can vary substantially from device to device, making operation erratic. Traditional electrostatic devices have relatively large and variable operating voltage characteristics. It would be advantageous to be able to control the attributes of the air gap through the design of the electrostatic actuator. Lower operating voltage devices could be developed. The variation in operating voltage required for a given device could be minimized. Thus, more predictable electrostatic actuators could be developed. By properly designing the air gap in an electrostatic device, the operation of the device could be helped instead of hindered.

There is still a need to develop improved MEMS devices and techniques for leveraging electrostatic forces and causing motion within microengineered devices. Electrostatic forces due to the electric field between electrical charges can generate relatively large forces given the small electrode separations in MEMS devices. These forces are readily controlled by applying a difference in voltage between MEMS electrodes, resulting in relatively large amounts of motion. Electrostatic devices operable with lower and less erratic operating voltages are needed. Advantageous new devices and applications could be created by leveraging the electrostatic forces in new MEMS structures.

SUMMARY OF THE INVENTION

It is an object of the present invention to provide MEMS electrostatic actuators operable with lower operating voltages.

In addition, it is an object of the present invention to provide MEMS electrostatic actuators that are easier to control and more predictable in operation.

Further, it is an object of the present invention to provide MEMS electrostatic actuators having a non-increasing air gap between the actuator electrode and substrate electrode.

The present invention provides improved MEMS electrostatic actuators that leverage electrostatic forces and enable various MEMS applications. In addition, a MEMS electrostatic attenuator of electromagnetic radiation is provided by the present invention. Further, a method for attenuating electromagnetic radiation is provided by the present invention.

A MEMS device driven by electrostatic forces according to the present invention comprises a microelectronic substrate, a substrate electrode, a flexible composite, and an insulator. A microelectronic substrate defines a planar surface upon which the MEMS device is constructed. The substrate electrode forms a layer on the surface of the microelectronic substrate. The flexible composite overlies the substrate electrode. In cross section, the flexible composite comprises an electrode layer and a biasing layer. The flexible composite across its length comprises a fixed portion attached to the underlying surface, a medial portion defining a non-increasing air gap between the substrate electrode and composite electrode, and a distal portion moveable with respect to the substrate electrode. The insulator electrically isolates and separates the substrate electrode from the flexible composite electrode. Applying a voltage differential between the substrate electrode and flexible composite electrode creates an electrostatic force that moves the distal portion and alters the separation from the underlying planar surface. A non-increasing air gap is maintained regardless of the application of electrostatic force.

Another embodiment of the MEMS electrostatic device provides a generally constant air gap between the substrate electrode and the composite electrode. A cantilevered region is defined in the medial portion of the flexible composite as it extends from the fixed portion to the distal portion. An additional embodiment provides a generally decreasing air gap between the substrate electrode and flexible composite electrode of the MEMS electrostatic device. In this case, the air gap is larger proximate the fixed portion and decreases as the medial portion extends from the fixed portion to the distal portion. A further embodiment defines a contact zone where the air gap reaches zero as the composite contacts the underlying layer where the medial portion transitions to the distal portion. Another embodiment maintains the air gap substantially constant whether or not electrostatic forces are generated between the substrate electrode and composite electrode layer. Lower and more predictable operating voltages are provided by customizing the design of the medial portion and limiting the air gap spacing.

A MEMS attenuator of electromagnetic radiation driven by electrostatic forces is also provided by the present invention. The attenuator includes a source of electromagnetic radiation directing radiation along at least one predetermined path. Further, the MEMS attenuator also comprises a MEMS electrostatic device as described above. The attenuator includes a microelectronic substrate, a substrate electrode, an insulator, and a flexible composite as previously defined. Controlled application of electrostatic force to the attenuator causes the distal portion of the flexible composite to selectively move into and out of the predetermined path of electromagnetic radiation. Another embodiment further includes a voltage source for creating a difference in voltage between the substrate electrode and flexible electrode resulting in an electrostatic force between the electrodes. Another embodiment further includes an array of electrostatic actuators disposed along at least one path of electromagnetic radiation. Other embodiments define components of the MEMS attenuator that transmit, block, or are transparent to electromagnetic radiation. Additional embodiments define the orientation of the flexible composite with respect to the path of electromagnetic radiation.

The present invention also provides a method of attenuating electromagnetic radiation using a MEMS electrostatic attenuator as defined above. The method comprises the steps of directing electromagnetic radiation along at least one predetermined path proximate to the electrostatic attenuator, selectively generating an electrostatic force between the substrate electrode and the electrode layer within the flexible composite, and moving the flexible composite a preselected distance for controllably obstructing or passing electromagnetic radiation traveling along at least one predetermined path. The flexible composite moves in response to the selective generation of electrostatic force between the substrate electrode and the flexible composite electrode layer. Some embodiments of the method further define the electromagnetic radiation path direction with respect to the flexible composite. Other embodiments define the direction the flexible composite moves in response to electrostatic force. One embodiment positionally biases the flexible composite actuator in the absence of electrostatic force. Yet other embodiments define the movement of the flexible composite in response to changes in the magnitude and direction of applied electrostatic force.

The present invention also provides a method of attenuating electromagnetic radiation using an array of MEMS electrostatic attenuators as defined above. This method comprises the steps of directing electromagnetic radiation along at least one path proximate to the array of MEMS electrostatic attenuators, selectively generating an electrostatic force between the electrodes of at least one MEMS attenuator within the array, and moving the flexible composite of at least one electrostatic MEMS attenuator within the array to selectively obstruct or pass electromagnetic radiation along at least one predetermined path. One embodiment of the method selectively generates electrostatic forces within a subset of the attenuators comprising the array. A further embodiment arranges a subset of attenuators into at least one row, while another embodiment arranges a subset of attenuators into at least one row and at least one column within the array of MEMS attenuators.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
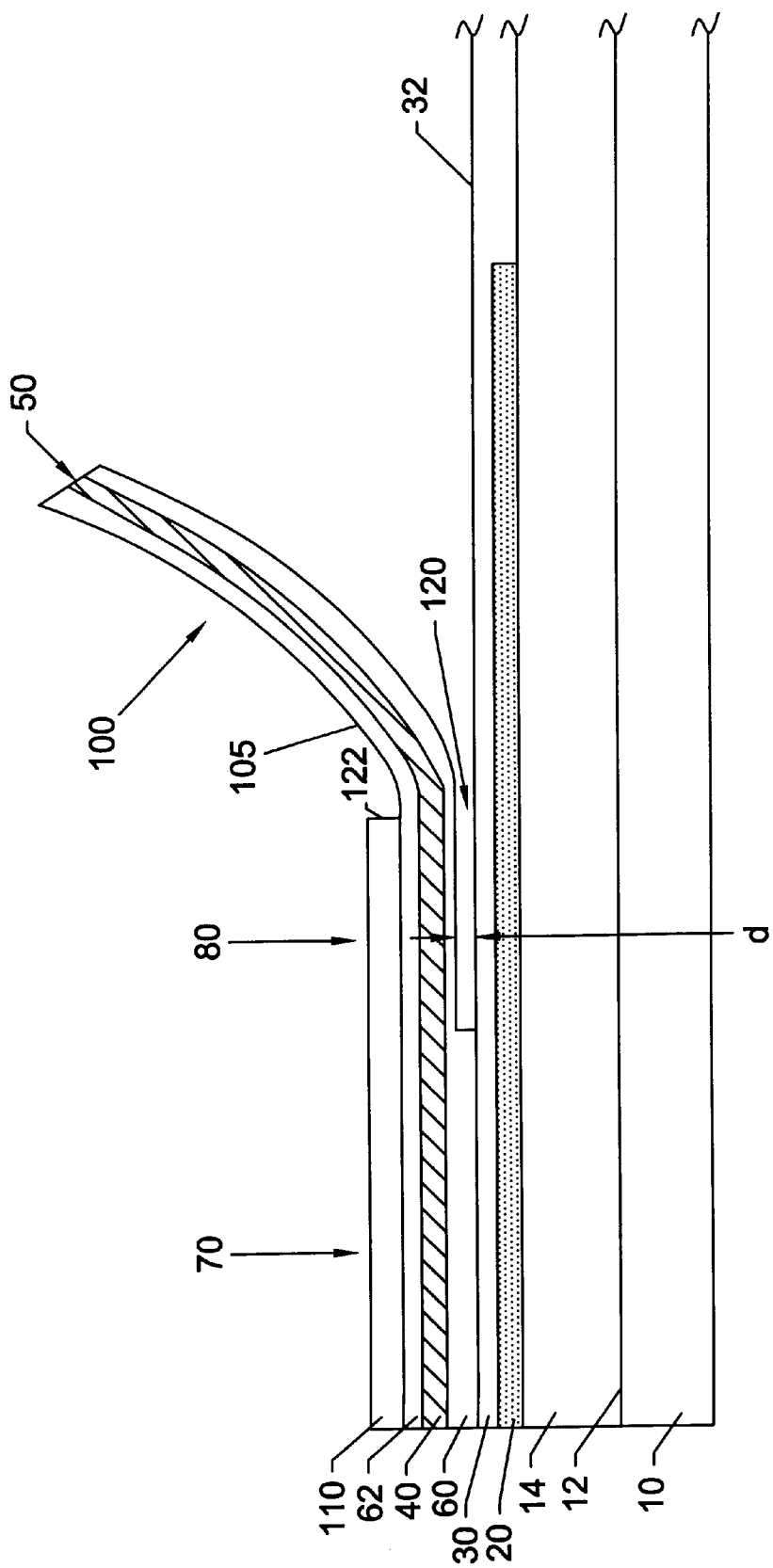
FIG. 1 is a cross-sectional view of the present invention, taken along the line 1—1 of FIG. 2.
Figure 2:
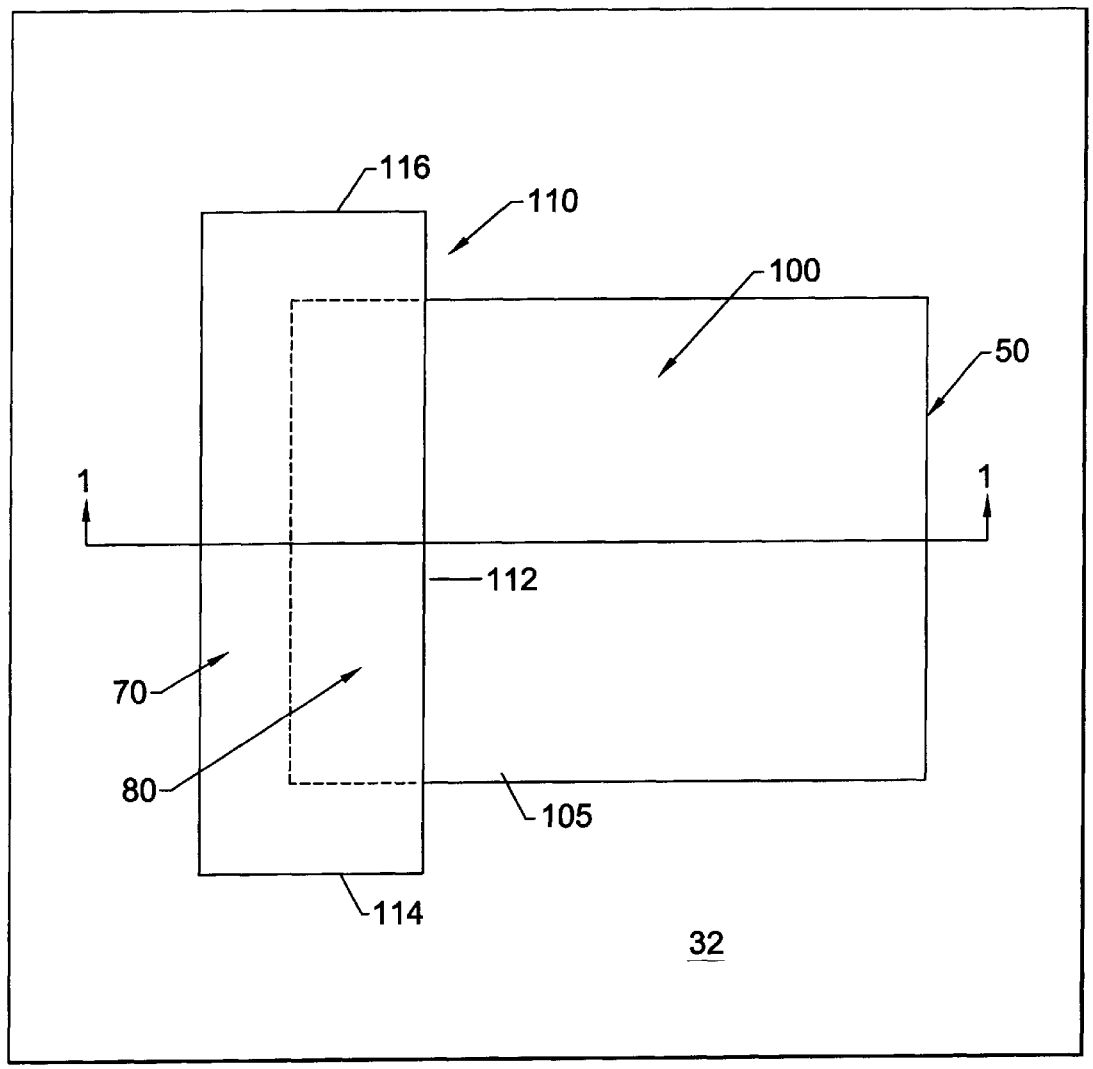
FIG. 2 is a top plan view of the present invention.

Referring to FIGS. 1 and 2, the present invention provides a MEMS device driven by electrostatic forces that requires relatively lower and more predictable operating voltages. In a first embodiment, an electrostatic MEMS device comprises in layers, a microelectronic substrate 10, a substrate electrode 20, a substrate insulator 30, and a flexible composite 50. The flexible composite is generally planar and overlies the microelectronic substrate and substrate electrode. Along its length, the flexible composite has a fixed portion 70, a medial portion 80, and a distal portion 100. The fixed portion is substantially affixed to the underlying microelectronic substrate or intermediate layers. The medial portion extends from the fixed portion and is held in position or biased without the application of electrostatic force, defining an air gap 120. The air gap has a predetermined non-increasing shape and is defined between the underlying planar surface and the medial portion. Both the medial portion and distal portion are released from the underlying substrate. The distal portion is free to move in operation, curling away and altering the separation from the underlying planar surface. The medial portion maintains a non-increasing separation, such as a constant or decreasing separation, with respect to the underlying planar surface until the flexible composite begins to bend toward the microelectronic substrate. Once the flexible composite bends accordingly, the medial portion can curl toward, curl away, or remain at a constant separation from the underlying planar surface.

In cross section, the flexible composite 50 comprises multiple layers including at least one electrode layer 40 and one or more biasing layers. The number of layers, thickness of layers, arrangement of layers, and choice of materials used may be selected to cause the flexible composite to curl toward, curl away, or remain parallel to the underlying microelectronic substrate electrode. Thus, the distal portion can be biased to curl as it extends away from the medial portion. The position of the medial portion with respect to the underlying substrate electrode can also be customized.

The electrostatic MEMS device is constructed using known integrated circuit materials and microengineering techniques. Those skilled in the art will understand that different materials, various numbers of layers, and numerous arrangements of layers may be used herein. Although the MEMS device illustrated in the Figures will be used as an example to describe manufacturing details, this discussion applies equally to all MEMS devices provided by the present invention unless otherwise noted. Referring to FIGS. 1 and 2, a microelectronic substrate 10 defines a planar surface 12 upon which the electrostatic MEMS device is constructed. Preferably the microelectronic substrate comprises a silicon wafer, although any suitable substrate material having a planar surface can be used. Other semiconductors, glass, plastics, or other materials may serve as the substrate. An insulating layer 14 overlies the planar surface of the microelectronic substrate and provides electrical isolation. The insulating layer 14 preferably comprises a non-oxidation based insulator or polymer, such as polyimide or nitride. In this case, oxide based insulators cannot be used if certain acids are used in processing to remove the release layer. Other insulators, even oxide based insulators, may be used if release layer materials and compatible acids or etchants are used for removing the release layer. For instance, silicon dioxide could be used for the insulating layers if etchants not containing hydrofluoric acid are used. The insulating layer is preferably formed by depositing a suitable material on the planar surface of the microelectronic substrate. A substrate electrode 20 is disposed as a generally planar layer affixed to the surface of the underlying insulating layer 14. The substrate electrode preferably comprises a gold layer deposited on the top surface of the insulating layer. A thin layer of chromium may be deposited onto the substrate electrode layer to allow better adhesion to the microelectronic substrate. Alternatively, other metallic or conductive materials may be used so long as they are not eroded by release layer processing operations. The surface area and shape of the substrate electrode 20 can be varied as required to create the desired electrostatic forces.

A second insulating layer 30 is deposited on the substrate electrode 20 to electrically isolate the substrate electrode and prevent electrical shorting. Further, the second insulating layer provides a dielectric layer of predetermined thickness between the substrate electrode 20 and the flexible composite, including the flexible electrode 40. The second insulating layer 30 preferably comprises polyimide, although other dielectric insulators or polymers tolerant of release layer processing may also be used. The second insulating layer 30 has a generally planar surface 32.

A release layer, not shown, is first deposited on the planar surface 32 in the area underneath the medial and distal portions of the overlying flexible composite, occupying the space shown as the air gap 120. The release layer is only applied to areas below flexible composite portions not being affixed to the underlying planar surface. Preferably, the release layer comprises an oxide or other suitable material that may be etched away when acid is applied thereto. After the overlying layers have been deposited, the release layer may be removed through standard microengineering acidic etching techniques, such as a hydrofluoric acid etch. When the release layer has been removed, the medial and distal portions of flexible composite 50 are separated from the underlying planar surface 32, creating the air gap therebetween.

The layers of the flexible composite 50 generally overlie planar surface 32, and, prior to removal, the release layer. The layers are arranged and shown vertically, while the portions are disposed horizontally along the flexible composite. Known integrated circuit manufacturing processes are also used to construct the layers comprising flexible composite 50. A first layer of polymer film 60 is applied to the release layer and exposed areas of planar surface 32. Polyimide is preferred for the first layer of polymer film, although other flexible polymers suitable for release layer processes may be used. At a minimum two layers comprise the flexible composite 50, one layer of polymer film 60, and a layer of flexible electrode 40. Alternatively, the minimum two layers could comprise a layer of flexible electrode 40 and a layer of polymer film 62. Different thermal coefficients of expansion between the layers comprising the flexible composite bias the medial portion 80 and distal portion 100 to curl away from the underlying surface 32 after removal of the release layer. The distal portion can curl with either a variable or constant radius of curvature.

Flexible electrode 40, comprising a layer of flexible conductor material, is deposited overlying the first layer of polymer film 60. Flexible electrode 40 preferably comprises gold, although other acid tolerant yet flexible conductors such as conductive polymer film may be used. The surface area or configuration of flexible electrode 40 can be varied as required to create the desired electrostatic force or vary it as a function of the distance from the inflection point 105.

A second layer of flexible polymer film 62 is applied over the flexible electrode layer. Alternatively, a thin layer of chromium may be deposited onto the flexible electrode layer to allow better adhesion to the layered polymer films. Wherever a gold layer is used, chromium can be applied if necessary to improve the adhesion of gold to the adjacent materials. Typically, this polymer film is flexible and has a different thermal coefficient of expansion than the electrode layer. Because the electrode layer and biasing layer components of the flexible composite expand at different rates, the flexible composite curls towards the layer having the lower thermal coefficient of expansion.

Of course, other techniques may be used to curl the flexible composite. For example, different depositon process steps can be used to create intrinsic stresses so as to curl the layers comprising the flexible composite. Further, the flexible composite can be curled by creating intrinsic mechanical stresses in the layers included therein. In addition, sequential temperature changes can be used to curl the flexible composite. For instance, the polymer film can be deposited as a liquid and then cured by elevated temperatures so that it forms a solid polymer layer. Preferably, a polymer having a higher thermal coefficient of expansion than the electrode layer can be used. Next, the polymer layer and electrode layer are cooled, creating stresses due to differences in the thermal coefficients of expansion. The flexible composite curls because the polymer layer shrinks faster than the electrode layer.

Because the medial portion is constructed similarly to the distal portion, the differential thermal coefficients of expansion between the electrode 40 and polymer film(s), tend to curl the medial portion. However, additional layers of polymer film, metals, or other materials may optionally be applied over the second layer of polymer film to serve as a biasing control structure to counteract the tendency to curl and hold the medial portion in position once the release layer has been removed.

Biasing control structures serve to counter the inherent tendency of the flexible composite to curl. As noted, differential thermal coefficients of expansion between layers serves to bias the flexible composite and cause it to curl. The curl is desired for the moveable distal portion, but is a disadvantage for the medial portion. It is important to provide a predictable medial portion shape and air gap for the electrostatic MEMS devices provided by the present invention because operating voltage characteristics are improved. For instance, a biasing control structure would be used to preserve the cantilevered medial portion and air gap shown in FIG. 2. Biasing control structures are used to support the medial portion for all embodiments of electrostatic MEMS devices according to the present invention. Absent a bias control structure, the flexible composite would begin to curl away from the substrate planar surface 32 at the beginning of the air gap, where the fixed portion of the composite transitions to the medial portion.

A first embodiment of a biasing control structure according to the present invention is shown in FIGS. 1 and 2. A biasing control layer 110 overlies the second polymer layer 62 and structurally constrains the medial portion 80. As shown, the biasing control layer overlies the fixed portion 70 of the flexible composite and extends over the air gap 120 and medial portion 80 of the composite to its terminal edge 112. Side portions 114 and 116 extend from the fixed portion 70 of the composite, over the edge of the composite, and are anchored to the planar surface 32 or some other layer that is ultimately attached to the substrate 10. In addition to layer 110, electrode layer 40 and polymer layers 60 and 62 could be extended out past the sides so as to hold the medial portion above the microelectronic substrate. As a result, the medial portion is stiffened on the top and three sides by the biasing control structure, limiting its flexibility. The biasing control structure also provides lateral support to the medial portion because it anchors the medial portion to the surrounding layers fixed to the microelectronic substrate. The biasing control structure can be formed from a metallized layer having a thermal coefficient of expansion tending to hold the medial portion in position. Other materials having a thermal coefficient of expansion different from the underlying flexible composite may be used to counteract the tendency to curl. The layer may be a generally solid planar surface, or may comprise lines, grids, cross-hatch, or other patterns as required to support the medial portion and control the air gap shape. The terminal edge 112 of the control layer also defines an inflection point or zone 105 at the transition from the medial to the distal portion of the composite. At the inflection point the air gap transitions from having a generally constant distance d under the medial portion 80 to an increasing distance under the distal portion 100 where the curl force of the composite causes it to move away from the planar surface, as shown.

Figure 3:
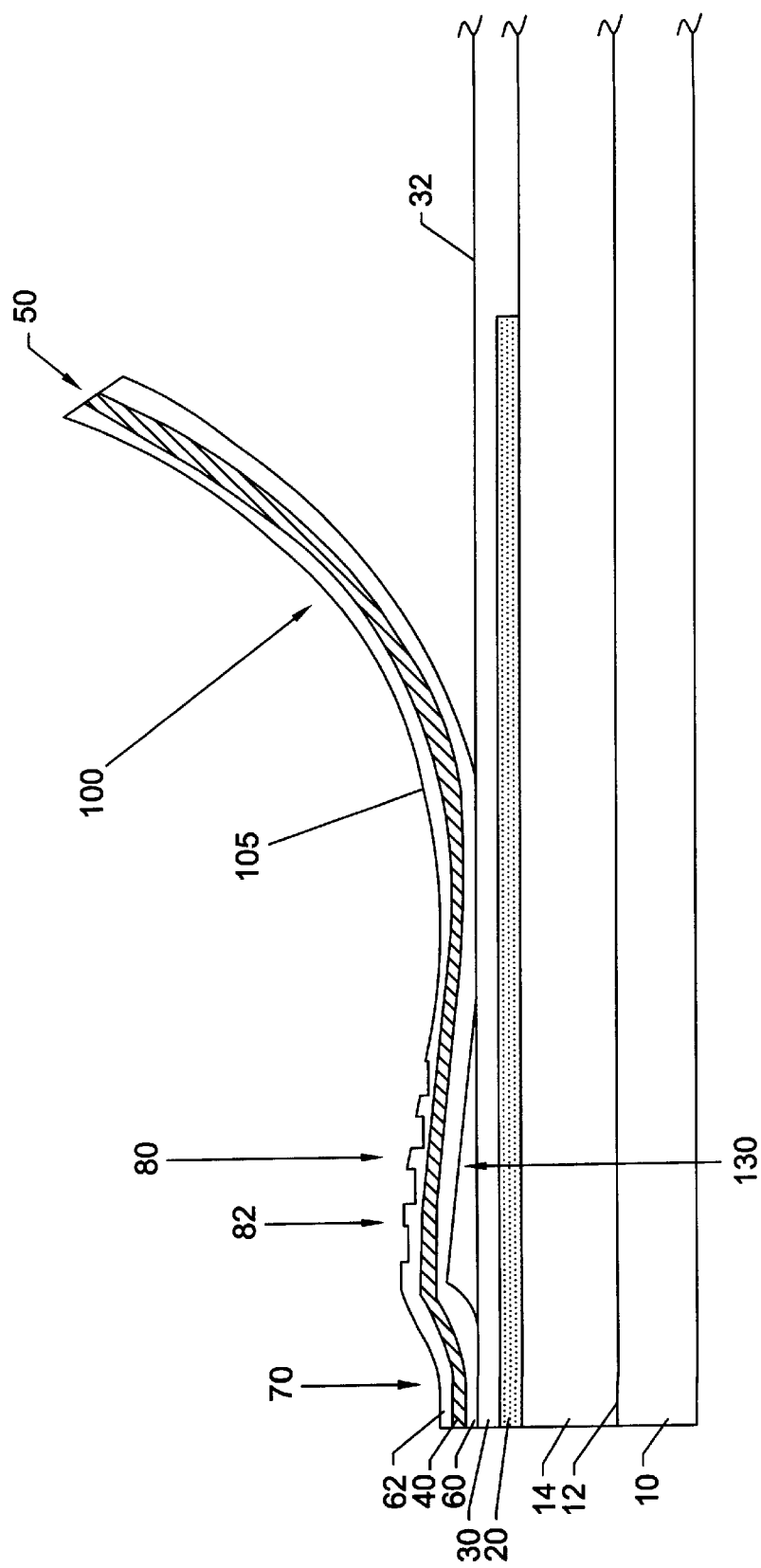
FIG. 3 is a cross-sectional view of an alternate embodiment of the present invention taken along the line 3—3 of FIG. 4.
Figure 4:
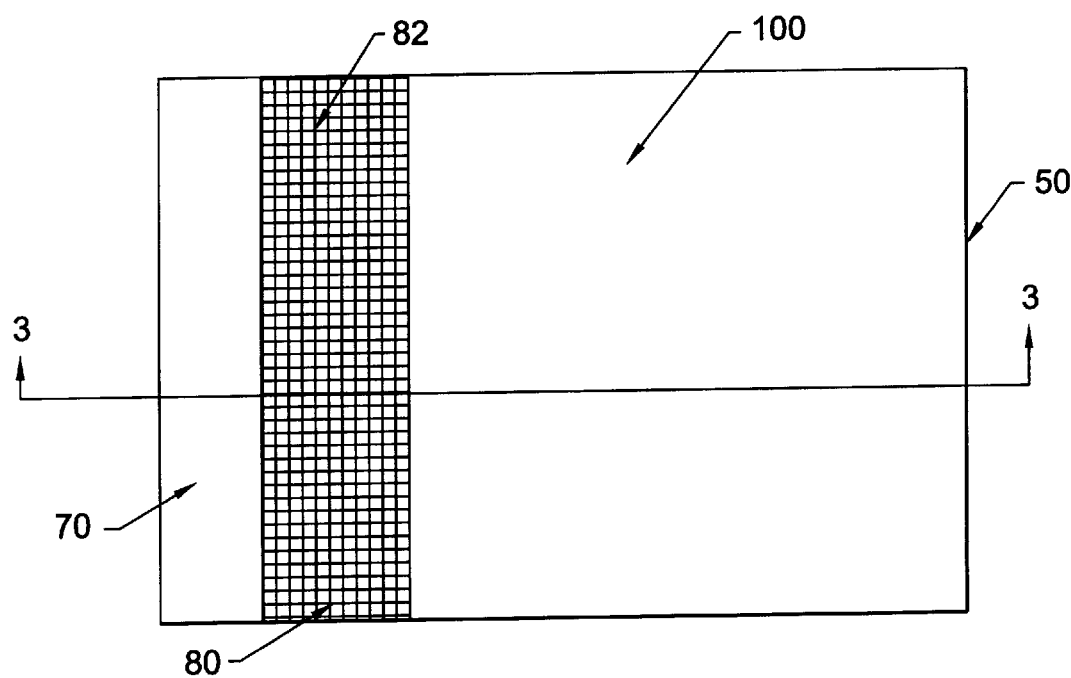
FIG. 4 is a top plan view of an alternate embodiment of the present invention.

Alternatively, the biasing control structure can affect the characteristics of the top surface of the medial portion, inherently holding the medial portion in position. The thickness of the second polymer film layer 62 can be altered to control the curling bias in the medial portion. For instance, the second layer can be thicker, thinner, or completely removed in some portion of the medial portion. Further, the second layer can be gridded, lined, cross-hatched, or otherwise patterned to modify the effective thermal coefficient of expansion and hold the medial portion in place. As shown in FIGS. 3 and 4, the second polymer film layer 62 may be patterned, or have portions removed, to have variable thickness over the span of the medial portion 80, thereby shaping, directing or reducing the force generated by thermal coefficients of expansion. In addition, it is possible to alter the thermal coefficient of expansion by adding impurities to the top layer comprising the medial portion. It is also possible to alter the thickness of other layers comprising the flexible composite or provide support underlying the medial portion to create a biasing control structure. Those skilled in the art will appreciate that other techniques may be used to achieve bias control in the medial portion. Further, combinations of the above techniques can be used to bias and position the medial portion and air gap. Alternatively, the distal portion 100 can curl toward or away from the underlying planar surface independent of the application of electrostatic force, by depositing the layers in a different order, or selecting different materials.

Thus, medial portion 80 acts like a cantilever member overlying planar surface 32 because a biasing control structure or modifications to the biasing layers hold the medial portion in position. Unlike conventional MEMS electrostatic actuators, the medial portion in this embodiment is held in place without applying electrostatic force. In addition, the shape of air gap 120 and the cantilevered medial portion and are held constant or decrease initially whether or not electrostatic force is applied to the MEMS device. By providing a controlled air gap, lower and more predictable operating voltages are provided by this embodiment of the present invention.

In operation, when no electrostatic force is applied the moveable distal portion is biased to curl naturally while extending from the inflection point, thereby altering the distance between the distal portion and the underlying planar surface. The application of electrical charge to the substrate electrode and flexible electrode creates an electrostatic force between them. The electrostatic force causes the moveable distal portion containing the flexible electrode to vary its separation with respect to the planar surface overlying the substrate electrode. Optionally, the electrostatic force can also cause the medial portion to vary its separation with respect to the planar surface. Preferably, the electrostatic force attracts the flexible electrode to the substrate electrode, causing the biased distal portion to uncurl and conform to the surface of the microelectronic substrate. Alternatively, the electrostatic force can repel the substrate and flexible electrodes, causing the moveable distal portion to curl away from the planar surface of the microelectronic substrate. The supported medial portion remains cantilevered in position defining a constant air gap above the underlying planar surface. The non-increasing air gap insures that relatively modest voltages, such as 30 volts for instance, may be used to initiate movement of the composite. An increasing air gap requires higher voltages, such as 80 volts for example.

Figure 5:
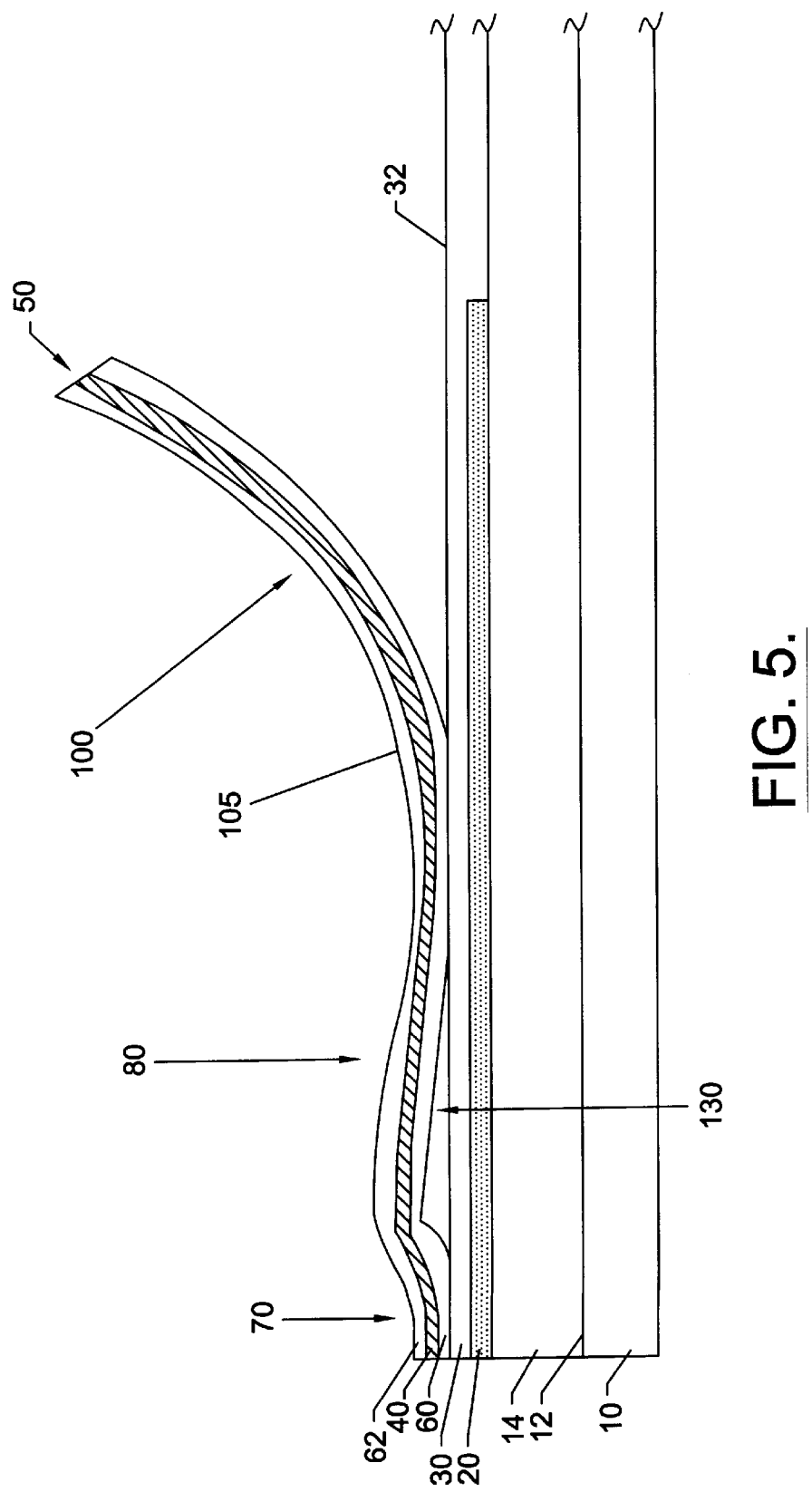
FIG. 5 is a cross-sectional view of an alternate embodiment of the present invention.

As shown in FIG. 2, a constant air gap 120 may be created between the medial portion and the underlying planar surface. Alternatively, a decreasing air gap 130 as shown in FIGS. 3 and 5 may be created, using the present invention wherein the medial portion contacts the underlying planar surface and a decreasing air gap is provided. The structure and construction of these MEMS devices is the same as previously discussed except with regard to the medial portion and air gap.

In FIGS. 3, 4 and 5, a portion of the second layer of polymer film 62 proximate the fixed portion 70 is removed forming a patterned area 82. The second layer of polymer film 62 has a higher thermal coefficient of expansion than the flexible electrode 40 or the underlying combination of layers forming the flexible composite 50 such as polymer film 60 and flexible electrode 40. The removal of the second layer of polymer film 62 in the medial portion causes the flexible composite 50 to curl toward the underlying planar surface 32 when no electrostatic forces are applied. This curl results because the thermal coefficient of expansion of flexible electrode 40 controls and causes the medial portion to approach the underlying planar surface 32. Ultimately the medial portion tangentially contacts the underlying planar surface and is supported thereby. Moveable distal portion 100 begins at an inflection point 105 where the flexible composite 50 begins to separate anew and curl upwardly from the underlying planar surface 32. The moveable distal portion 100 can curl toward or away from the underlying planar surface 32 of the insulator 30 according to the materials used and the number and order of the component layers forming the flexible composite 50. Alternatively, an additional layer, such as another polymer layer, can be deposited overlying polymer layer 62 in the medial portion 80 in order to curl the medial portion toward the microelectronic substrate.

The different MEMS devices disclosed are similar in operation. Without applying electrostatic force, the distal portion is naturally curved. Once the substrate electrode and flexible electrode are energized, an electrostatic force is created therebetween. Because the air gap is controlled, or the flexible composite contacts the insulator near the substrate electrode, the embodiments shown operate with lower and more predictable operating voltages. Once the proper amount of electrical potential is applied, electrostatic forces move the distal portion having the flexible electrode. The separation between the moveable distal portion and the underlying planar surface varies in response to an applied electrostatic force. Preferably, the biased medial portion and air gap retain the shapes shown whether or not electrostatic forces are applied. Alternatively, the medial portion can be electrostatically attracted toward the underlying planar surface as previously discussed. The operating characteristics and predictability of the electrostatic MEMS devices provided by the present invention are enhanced by design.

The electrostatic MEMS devices provided by the present invention can operate as an attenuator of electromagnetic energy. Visible light, infrared, laser, or magnetic or radio frequency radiation may be selectively attenuated, reflected, or passed through the MEMS attenuator. The variable position of the distal portion blocks varying amounts of light beam or other electromagnetic radiation. For instance, the distal portion can be moved so as to totally clear or totally intersect the path of electromagnetic radiation. Alternatively, the distal portion can be moved to partially intersect the path of electromagnetic radiation, permitting an analog control of the amount of electromagnetic radiation passed. The beam can be traveling parallel to the substrate surface in which case the actuation of the device pulls the distal portion down out of the light beam path. Alternatively, the beam could be transmitted through a transparent substrate with a transparent fixed electrode, where the actuation of the device pulls the distal portion down in the light path. The surface of the flexible composite could be coated with a thin film of a highly reflective material to minimize the heating of the film by the beam. For the case of the beam traveling parallel to the surface, multiple actuators could be used to attenuate the beam. A series of actuators along the path of the beam would provide either redundancy or an "OR" type logic. Similarly, two or more (depending on the beam size and (actuator size) actuators placed across the path of the beam would provide an "AND" type logic. Because the radius of curvature of the composite is controlled by the thicknesses and material choices of the flexible film, beams of different sizes and spacings from the substrate can be attenuated through control of the device design.

With a curled flexible composite, the reflected radiation will be dispersed over a range of angles depending on the composite curvature and beam properties. Greater control over the reflected light can be achieved by leaving the flexible composite flat and not curled. This can be done through the removal of some of the materials at the distal end, by controlling the thicknesses of the materials, or by adding other materials. The flat surface of the distal end will then reflect the light with less dispersion. The use of a flat end in the distal portion furthest from the medial portion will also allow the actuator to block films at greater heights from the substrate without increasing the curvature. Accordingly, depending on the application, the end of the distal portion furthest from the medial portion can either be curled or relatively flat.

Figure 6:
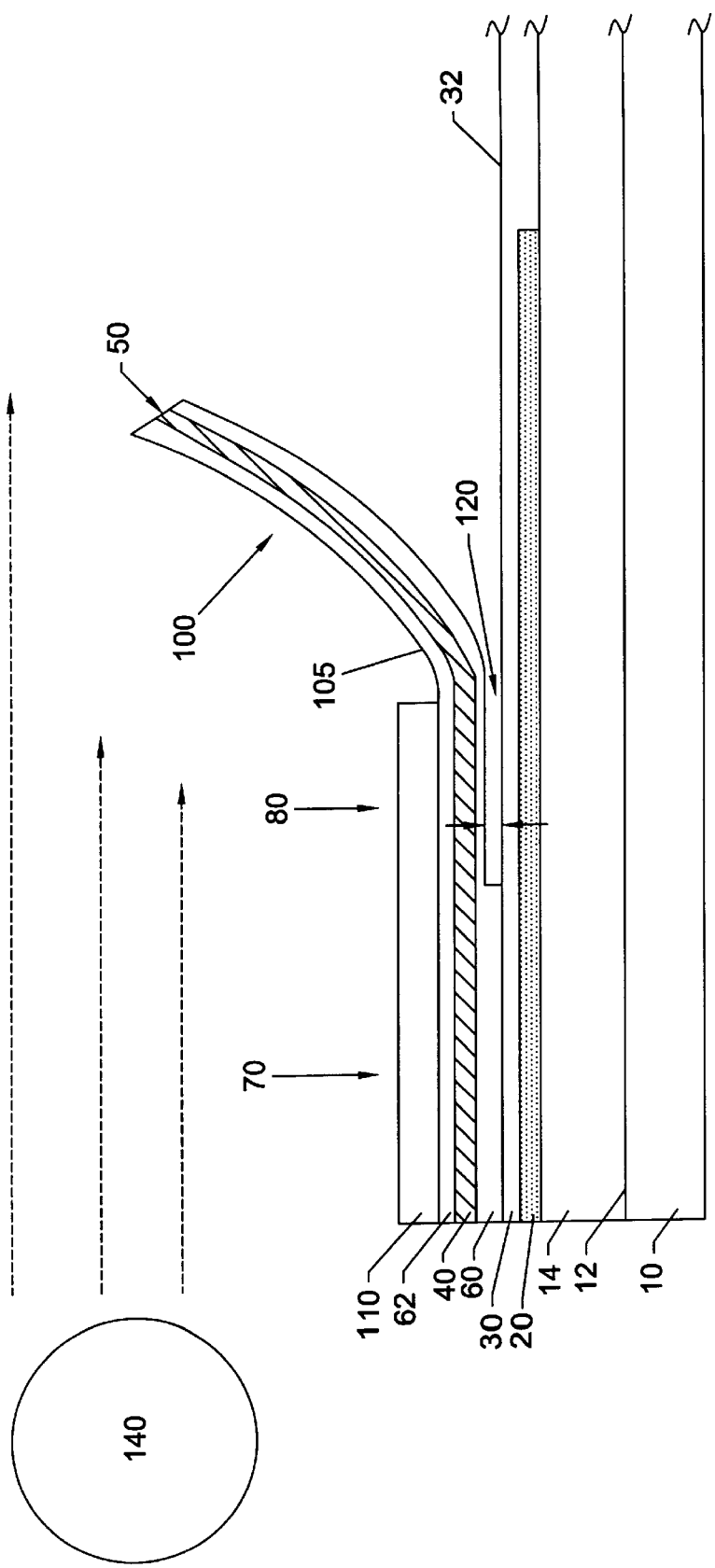
FIG. 6 is a cross-sectional view of the invention used as a radiation attenuator.
Figure 7:
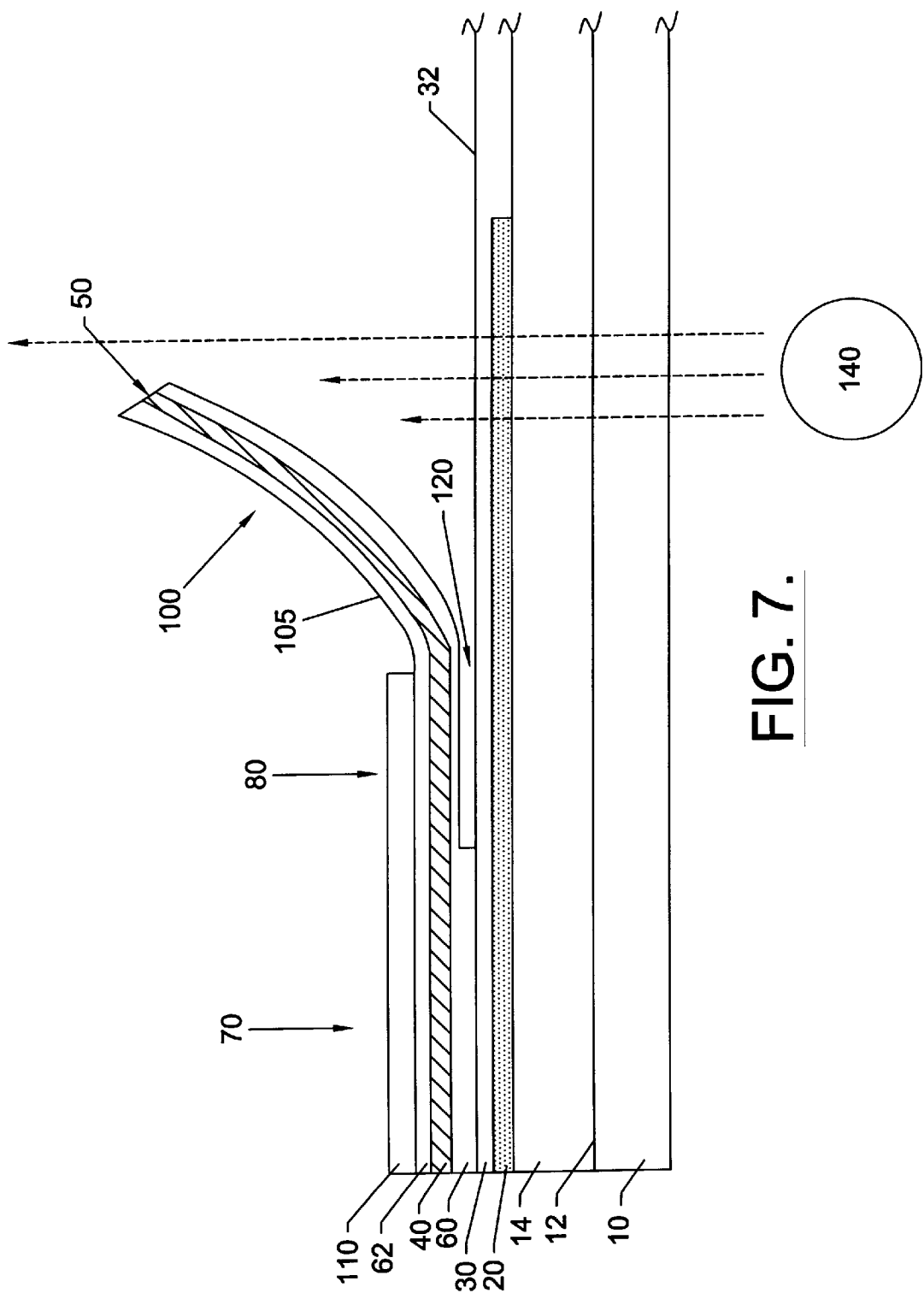
FIG. 7 is a cross-sectional view of an alternate embodiment of the invention used as a radiation attenuator.

A MEMS electrostatic attenuator according to the present invention comprises a source of electromagnetic radiation and a MEMS electrostatic device as previously described. FIGS. 6 and 7 show an electrostatic attenuator according to the present invention. The source of electromagnetic radiation 140 is directed along at least one predetermined path. As shown in FIG. 6, a path of electromagnetic radiation may intersect the flexible composite 50. Alternatively, electromagnetic radiation may be directed along a path perpendicular to the plane defined by microelectronic substrate 10, as shown in FIG. 7. Depending on the type of electromagnetic radiation being attenuated, the construction of the MEMS electrostatic device may vary to some extent.

The material forming microelectronic substrate 10 may be selected according to attenuation characteristics of the material for a given type of electromagnetic radiation. For instance, a substrate material may be selected that transmits, blocks, or reflects a beam of electromagnetic radiation directed at the substrate. For example, a glass substrate may be used to reflect or block a beam of visible light. The substrate electrode 20 and flexible composite 50 can also be constructed from materials having the desired attenuation on a certain type of electromagnetic radiation. Further, the flexible composite 50 may have one or more surfaces that reflect electromagnetic energy. For instance, the upper surface, lower surface, or both surfaces of a flexible electrode may reflect a laser beam.

Figure 8:
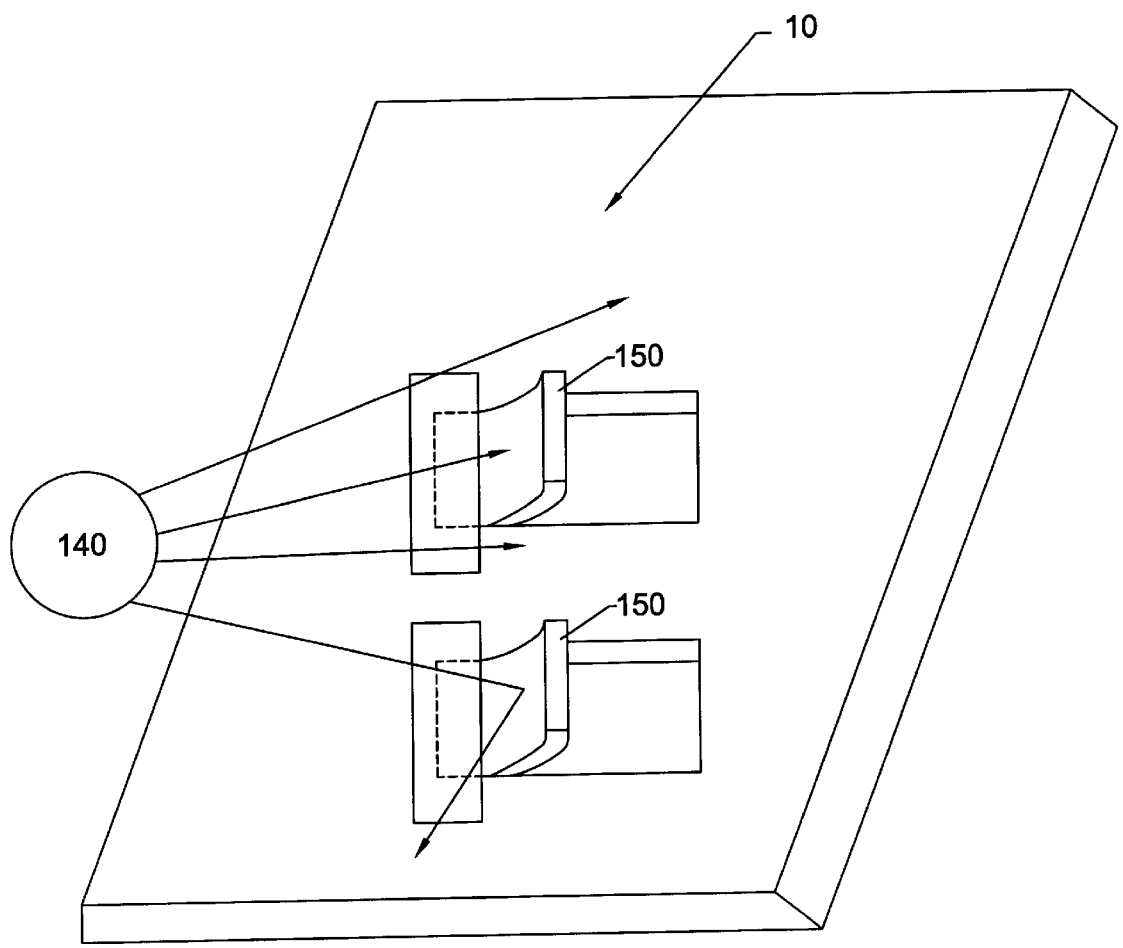
FIG. 8 is a perspective view of an array of the devices of the present invention.

FIG. 8 shows a plurality of electrostatic attenuators 150 comprising an array. The material surrounding the actuator movable flexible composite may be retained to form a well, as shown in FIG. 8, or removed as shown in FIG. 1. As shown, the path of electromagnetic radiation may intersect one or more attenuators within the array. All or a coordinated subset of the attenuators within the array may be activated. Subsets of attenuators may be arranged in any manner, including rows, columns, or in other organizations.

The present invention further provides a method of attenuating electromagnetic radiation using an electrostatic MEMS attenuator described above. The method comprises the steps of directing electromagnetic radiation, selectively generating an electrostatic force, and moving the flexible composite of the attenuator to selectively obstruct or clear electromagnetic radiation traveling along at least one predetermined path.

The directing step can comprise directing the electromagnetic radiation along a predetermined path generally parallel or perpendicular to the plane defined by the flexible composite. The moving step can comprise moving the flexible composite away from or towards the substrate. Alternatively, the moving step may comprise biasing the flexible composite to move in a predetermined direction relative to the microelectronic substrate absent an electrostatic force between the substrate and composite electrodes. Optionally the moving step can comprise controlling the degree of movement of the flexible composite by varying the magnitude of the electrostatic force generated between the electrodes.

The present invention further provides a method of attenuating electromagnetic radiation using an array of electrostatic MEMS attenuators. The method comprises the step of directing electromagnetic radiation along at least one path proximate the array of attenuators. The method further comprises the step of selectively generating an electrostatic force between the substrate and flexible composite electrodes within at least one electrostatic attenuator selected from the array. Lastly, the method comprises the step of moving the flexible composite for at least one selected electrostatic attenuator within the array a predetermined distance to selectively obstruct or clear at least one path of electromagnetic radiation proximate the attenuator array. As before, the path of electromagnetic radiation can be totally obstructed, partially obstructed, or not obstructed at all. The selectively generating step can optionally comprise activating a subset of electrostatic attenuators within the array. The moving step may optionally comprise arranging a subset of arrayed electromagnetic attenuators into at least one row, and moving the flexible composites corresponding to the attenuators within at least one row. Alternatively, the moving step can comprise arranging a subset of arrayed electrostatic attenuators into at least one row and at least one column, and moving the flexible composites corresponding to attenuators within at least one row and at least one column.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limiting the scope of the present invention in any way.

That which is claimed:

1. A MEMS device driven by electrostatic forces, comprising:
   a microelectronic substrate defining a planar surface;
   a substrate electrode forming a layer on the surface of the substrate;
   a flexible composite overlying the substrate electrode and having an electrode layer and a biasing layer, the composite having a fixed portion attached to the underlying surface, a generally stationary medial portion defining a non-increasing air gap between the substrate electrode and the composite electrode, and a distal portion movable with respect to the substrate electrode; and
   an insulator electrically separating said substrate electrode from said flexible electrode.

2. A MEMS device according to claim 1 wherein said medial portion defines a generally constant air gap between the substrate electrode and the composite electrode and extending from the fixed portion to the distal portion.

3. A MEMS device according to claim 1 wherein said medial portion defines a generally decreasing air gap between the substrate electrode and the composite electrode, with the air gap being largest proximate the fixed portion and decreasing toward the distal portion.

4. A MEMS device according to claim 1 wherein said medial portion defines a contact zone where the air gap decreases to zero at a location between the fixed portion and distal portion.

5. A MEMS device according to claim 1, wherein said air gap generally maintains shape with or without the generation of an electrostatic force between the substrate electrode and the composite electrode layer.

6. A MEMS device according to claim 1, wherein said substrate electrode underlies substantially the entire area of the medial and distal portions of the flexible composite.

7. A MEMS device according to claim 1, wherein said insulator is attached to and overlies said substrate electrode.

8. A MEMS device according to claim 1, further comprising an insulator between said substrate and said substrate electrode.

9. A MEMS device according to claim 1, wherein said composite biasing layer comprises at least one polymer film.

10. A MEMS device according to claim 1, wherein said composite biasing layer comprises polymer films on opposite sides of said composite electrode layer.

11. A MEMS device according to claim 1 wherein said composite biasing layer and electrode layer have different coefficients of expansion, urging the composite to curl.

12. A MEMS device according to claim 1 wherein said biasing layer comprises at least two polymer films of different thicknesses, urging the composite to curl.

13. A MEMS device according to claim 1 wherein said biasing layer comprises at least two polymer films of different coefficients of expansion, urging the composite to curl.

14. A MEMS device according to claim 1 wherein said biasing layer and the electrode layer in the composite have different levels of stress, urging the composite to curl.

15. A MEMS device according to claim 9 wherein said polymer film is thinner in the medial portion than in the distal portion.

16. A MEMS device according to claim 9 wherein said polymer film is patterned in the medial portion to remove at least some of the polymer film.

17. A MEMS device according to claim 1, wherein the distal portion of said flexible composite curls out of the plane defined by the upper surface of the composite when no electrostatic force is created between said composite electrode and said flexible electrode.

18. A MEMS device according to claim 17 wherein the flexible composite has different radii of curvature at different locations on the distal portion.

19. A MEMS device according to claim 1, wherein said composite medial portion is generally flatter than the composite distal portion.

20. A MEMS device according to claim 1, wherein the surface area of said substrate electrode comprises generally the same surface area as said flexible electrode.

21. A MEMS device according to claim 1, wherein the shape of said substrate electrode is generally the same as the shape of said flexible electrode.

22. A MEMS device according to claim 1, wherein said flexible composite has a generally rectangular shape.

23. A MEMS device according to claim 1, wherein said flexible composite generally curled away from the underlying substrate from the proximal portion to the movable distal portion.

24. A MEMS device according to claim 1, wherein said flexible composite has at least one reflective surface portion selected from the group consisting of a reflective upper surface and a reflective lower surface.

25. A MEMS device according to claim 1, wherein the composite further comprises a stiffened layer overlying the medial portion, reducing the flexibility of said medial portion.

26. A MEMS device according to claim 1, further comprising a bridging layer extending from the lateral portions of the medial portion of the flexible composite to the adjacent substrate, reducing the flexibility of said medial portion.

27. A MEMS electrostatic attenuator of electromagnetic radiation, comprising:
    a source of electromagnetic radiation, wherein the electromagnetic radiation is directed along at least one predetermined path;
    at least one MEMS electrostatic radiation attenuator proximate said radiation path and comprising
    a microelectronic substrate defining a planar surface;
    a substrate electrode forming a layer on the surface of the substrate;
    a flexible composite overlying the substrate electrode and having an electrode layer and a biasing layer, the composite having a fixed portion attached to the underlying surface, a generally stationary medial portion defining a non-increasing air gap between the substrate electrode and the composite electrode, and a distal portion movable with respect to the substrate electrode; and
    an insulator electrically separating said substrate electrode from said flexible electrode.

28. A MEMS electrostatic attenuator according to claim 27 further comprising a voltage source, wherein the application of a voltage differential between said substrate electrode and said electrode layer creates an electrostatic force moving the distal portion of said flexible composite into and out of said at least one predetermined path of electromagnetic radiation.

29. A MEMS electrostatic attenuator according to claim 27 further comprising an array of said electrostatic attenuators disposed along at least one path of electromagnetic radiation.

30. A MEMS electrostatic attenuator according to claim 27 wherein said microelectronic substrate transmits electromagnetic radiation of the type being attenuated.

31. A MEMS electrostatic attenuator according to claim 27 wherein said substrate electrode transmits electromagnetic radiation of the type being attenuated.

32. A MEMS electrostatic attenuator according to claim 27 wherein said flexible composite blocks the transmission of electromagnetic radiation of the type being attenuated.

33. A MEMS electrostatic attenuator according to claim 27 wherein said flexible composite is disposed parallel to said at least one path of electromagnetic radiation.

34. A MEMS electrostatic attenuator according to claim 27 wherein said flexible composite is disposed perpendicular to said at least one path of electromagnetic radiation.

35. A method of attenuating electromagnetic radiation using a MEMS electrostatic attenuator having a microelectronic substrate having a substrate electrode, and a flexible composite having an electrode layer, the composite having a fixed portion attached to the underlying surface, a generally stationary medial portion defining a non-increasing air gap between the substrate electrode and the composite electrode, and a distal portion movable in response to an electrostatic force created between the substrate electrode and the electrode layer, the method comprising the steps of:
    directing electromagnetic radiation along at least one predetermined path proximate the electrostatic attenuator;
    selectively generating an electrostatic force between the substrate electrode and the electrode layer of the flexible composite and
    moving the flexible composite a predetermined distance to selectively obstruct or clear electromagnetic radiation traveling along at least one predetermined path in response to the electrostatic force.

36. A method of attenuating electromagnetic radiation using a MEMS electrostatic attenuator according to claim 35, wherein said directing step comprises directing the electromagnetic radiation along a predetermined path generally parallel to the plane defined by said flexible composite.

37. A method of attenuating electromagnetic radiation using a MEMS electrostatic attenuator according to claim 35, wherein said directing step comprises directing the electromagnetic radiation along a predetermined path generally perpendicular to the plane defined by said flexible composite.

38. A method of attenuating electromagnetic radiation using a MEMS electrostatic attenuator according to claim 35, wherein said moving step comprises moving the flexible composite generally away from the substrate electrode, in response to the selective generation of electrostatic force between the substrate electrode and the electrode layer.

39. A method of attenuating electromagnetic radiation using a MEMS electrostatic attenuator according to claim 35, further comprising the step of biasing the flexible composite to move in a predetermined direction relative to said microelectronic substrate absent an electrostatic force between the substrate electrode and the electrode layer.

40. A method of attenuating electromagnetic radiation using a MEMS electrostatic attenuator according to claim 35, wherein said moving step comprises controlling the degree of movement of said flexible composite by varying the magnitude of the electrostatic force generated between said substrate electrode and said electrode layer.

41. A method of attenuating electromagnetic radiation using an array of MEMS electrostatic attenuators, each having a microelectronic substrate having a substrate electrode, a flexible composite having an electrode layer, the composite having a fixed portion attached to the underlying surface, a generally stationary medial portion defining a non-increasing air gap between the substrate electrode and the composite electrode, and a distal portion movable in response to an electrostatic force generated between said substrate electrode and said electrode layer, the method comprising the steps of:

directing electromagnetic radiation along at least one predetermined path proximate an array of electrostatic attenuators;

selectively generating an electrostatic force between said substrate electrode and said electrode layer for at least one selected electrostatic attenuator within the array of electrostatic attenuators; and moving the flexible composite for the at least one selected electrostatic attenuator within the array of electrostatic attenuators a predetermined distance to selectively obstruct or clear electromagnetic radiation traveling along at least one predetermined path in response to the selective generation of electrostatic force.

42. A method of attenuating electromagnetic radiation according to claim 41, wherein said selectively generating step comprises activating a subset of said electrostatic attenuators within said array.

43. A method of attenuating electromagnetic radiation according to claim 41, wherein said moving step comprises arranging a subset of said electrostatic attenuators within said array into at least one row and moving the flexible composites within said at least one row.

44. A method of attenuating electromagnetic radiation according to claim 41, wherein said moving step comprises arranging a subset of said electrostatic attenuators within said array into at least one row and at least one column and moving the flexible composites within said at least one row and at least one column.

45. A MEMS device driven by electrostatic forces, comprising:

a microelectronic substrate defining a planar surface;

a substrate electrode forming a layer on the surface of the substrate;

a flexible composite overlying the substrate electrode and having an electrode layer and a biasing layer, the composite having a fixed portion attached to the underlying surface, a medial portion defining a generally decreasing air gap between the substrate electrode and the composite electrode, with the air gap being largest proximate the fixed portion and decreasing therefrom, and a distal portion movable with respect to the substrate electrode; and an insulator electrically separating said substrate electrode from said flexible electrode.

46. A MEMS device according to claim 45, wherein said medial portion defines a contact zone where the air gap decreases to zero at a location between the fixed portion and distal portion.

47. A MEMS device driven by electrostatic forces, comprising:

a microelectronic substrate defining a planar surface;

a substrate electrode forming a layer on the surface of the substrate;

a flexible composite overlying the substrate electrode and having an electrode layer and a biasing layer, the composite having a fixed portion attached to the underlying surface, a medial portion defining a non-increasing air gap between the substrate electrode and the composite electrode, and a distal portion movable with respect to the substrate electrode that curls out of a plane defined by an upper surface of the composite when no electrostatic force is created between the substrate electrode and the composite electrode; and an insulator electrically separating said substrate electrode from said flexible electrode.

48. A MEMS device according to claim 47, wherein the flexible composite has different radii of curvature at different locations on the distal portion.

49. A MEMS device according to claim 47, wherein said composite medial portion is generally flatter than the composite distal portion.

50. A MEMS device according to claim 47, further comprising an insulator between said substrate and said substrate electrode.

51. A MEMS device according to claim 47, wherein said composite biasing layer comprises at least one polymer film.

52. A MEMS device according to claim 47, wherein said composite biasing layer comprises polymer films on opposite sides of said composite electrode layer.

53. A MEMS device according to claim 47, wherein said composite biasing layer and electrode layer have different coefficients of expansion, urging the composite to curl.

54. A MEMS device according to claim 47, wherein said biasing layer comprises at least two polymer films of different thicknesses, urging the composite to curl.

55. A MEMS device according to claim 47, wherein said biasing layer comprises at least two polymer films of different coefficients of expansion, urging the composite to curl.

56. A MEMS device according to claim 47, wherein said biasing layer and the electrode layer in the composite have different levels of stress, urging the composite to curl.

57. A MEMS device according to claim 51 wherein said polymer film is thinner in the medial portion than in the distal portion.

58. A MEMS device according to claim 51 wherein said polymer film is patterned in the medial portion to remove at least some of the polymer film.

59. A MEMS device according to claim 47, wherein said flexible composite has at least one reflective surface portion selected from the group consisting of a reflective upper surface and a reflective lower surface.

60. A MEMS device according to claim 47, further comprising a stiffening layer overlying the medial portion of the flexible composite that reduces the flexibility of said medial portion.

61. A MEMS electrostatic attenuator of electromagnetic radiation, comprising:

a source of electromagnetic radiation, wherein the electromagnetic radiation directed along at least one predetermined path;

at least one MEMS electrostatic radiation attenuator proximate said radiation path and comprising
        a microelectronic substrate defining a planar surface;
        a substrate electrode forming a layer on the surface of the substrate;
        a flexible composite overlying the substrate electrode and having an electrode layer and a biasing layer, the composite having a fixed portion attached to the underlying surface, a medial portion defining a non-increasing air gap between the substrate electrode and the composite electrode, and a distal portion movable with respect to the substrate electrode; and an insulator electrically separating said substrate electrode from said flexible electrode, wherein said flexible composite blocks the transmission of electromagnetic radiation of the type being attenuated.

62. A MEMS electrostatic attenuator according to claim 61, wherein said microelectronic substrate transmits electromagnetic radiation of the type being attenuated.

63. A MEMS electrostatic attenuator according to claim 61, wherein said substrate electrode transmits electromagnetic radiation of the type being attenuated.

64. A MEMS electrostatic attenuator according to claim 61, wherein said flexible composite is disposed parallel to said at least one path of electromagnetic radiation.

65. A method of attenuating electromagnetic radiation using a MEMS electrostatic attenuator having a microelectronic substrate having a substrate electrode, and a flexible composite having an electrode layer, the flexible composite movable in response to an electrostatic force created between the substrate electrode and the electrode layer, the method comprising the steps of:

directing electromagnetic radiation along at least one predetermined path proximate the electrostatic attenuator;

selectively generating an electrostatic force between the substrate electrode and the electrode layer of the flexible composite and moving the flexible composite generally away from the substrate electrode a predetermined distance in response to the selective generation of electrostatic force between the substrate electrode and the electrode layer thereby selectively obstructing electromagnetic radiation traveling along at least one predetermined path.

66. A method of attenuating electromagnetic radiation using a MEMS electrostatic attenuator according to claim 65, wherein said directing step comprises directing the electromagnetic radiation along a predetermined path generally parallel to the plane defined by said flexible composite.

67. A method of attenuating electromagnetic radiation using a MEMS electrostatic attenuator according to claim 65, further comprising the step of biasing the flexible composite to move in a predetermined direction relative to said microelectronic substrate absent an electrostatic force between the substrate electrode and the electrode layer.

68. A method of attenuating electromagnetic radiation using a MEMS electrostatic attenuator according to claim 65, wherein said moving step comprises controlling the degree of movement of said flexible composite by varying the magnitude of the electrostatic force generated between said substrate electrode and said electrode layer.

69. A method of attenuating electromagnetic radiation using an array of MEMS electrostatic attenuators, each having a microelectronic substrate having a substrate electrode, a flexible composite having an electrode layer, the flexible composite movable in response to an electrostatic force generated between said substrate electrode and said electrode layer, the method comprising the steps of:

directing electromagnetic radiation along at least one predetermined path proximate an array of electrostatic attenuators;

selectively generating an electrostatic force between said substrate electrode and said electrode layer for at least one selected electrostatic attenuator within the array of electrostatic attenuators to thereby activate a subset of the electrostatic attenuators within the array; and moving the flexible composite for the at least one selected electrostatic attenuator within the array of electrostatic attenuators a predetermined distance to selectively obstruct or clear electromagnetic radiation traveling along at least one predetermined path in response to the selective generation of electrostatic force.

70. A method of attenuating electromagnetic radiation according to claim 69, wherein said moving step comprises arranging a subset of said electrostatic attenuators within said array into at least one row and moving the flexible composites within said at least one row.

71. A method of attenuating electromagnetic radiation according to claim 69, wherein said moving step comprises arranging a subset of said electrostatic attenuators within said array into at least one row and at least one column and moving the flexible composites within said at least one row and at least one column.

* * * * *

UNITED STATES PATENT AND TRADEMARK OFFICE
CERTIFICATE OF CORRECTION

PATENT NO.    : 6,236,491 B1
DATED         : May 22, 2001
INVENTOR(S)   : Goodwin-Johansson It is certified that error appears in the above-identified patent and that said Letters Patent is hereby corrected as shown below:

Title page,
Item [56], References Cited, U.S. PATENT DOCUMENTS, insert the following:
-- 5,345,521    9/1994       McDonald et al.
   5,784,190    7/1998       Worley --.

Item [56], References Cited, FOREIGN PATENT DOCUMENTS, insert the following:
-- 0614101     9/1994       (EP)
   19540363    5/1997       (DE) --.

Signed and Sealed this

Fourth Day of June, 2002

Attest:

Attesting Officer

JAMES E. ROGAN
*Director of the United States Patent and Trademark Office*